(12) United States Patent
Petter et al.

(10) Patent No.: US 6,417,063 B1
(45) Date of Patent: Jul. 9, 2002

(54) FOLDED DEEP TRENCH CAPACITOR AND METHOD

(75) Inventors: Robert Petter, Glen Allen; Mark Luzar, Chester; Violetta Schlesinger, Richmond, all of VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 0 days.

(21) Appl. No.: 09/599,824

(22) Filed: Jun. 22, 2000

(51) Int. Cl.[7] .............................................. H01L 21/20
(52) U.S. Cl. ....................... 438/386; 438/243; 438/244; 438/387
(58) Field of Search ................................ 257/301, 302, 257/303, 304; 438/243–249, 386–392

(56) References Cited

U.S. PATENT DOCUMENTS

| | | | | |
|---|---|---|---|---|
| 4,673,962 A | * | 6/1987 | Chatterjee et al. | 257/302 |
| 4,877,750 A | * | 10/1989 | Okumura | 438/387 |
| 5,592,412 A | | 1/1997 | Kleinhenz et al. | |
| 5,656,535 A | | 8/1997 | Ho et al. | |
| 5,670,805 A | | 9/1997 | Hammerl et al. | |
| 5,793,075 A | | 8/1998 | Alsmeier et al. | |
| 5,827,765 A | | 10/1998 | Stengl et al. | |
| 5,844,266 A | | 12/1998 | Stengl et al. | |
| 5,874,757 A | * | 2/1999 | Chao | 257/303 |
| 6,018,174 A | * | 1/2000 | Schrems et al. | 438/243 |
| 6,251,722 B1 | * | 4/2000 | Wei et al. | 438/243 |
| 6,066,527 A | * | 5/2000 | Kudelka et al. | 438/243 |
| 6,258,689 B1 | * | 7/2000 | Bronner et al. | 438/386 |
| 6,140,175 A | * | 10/2000 | Kleinhenz et al. | 438/243 |
| 6,150,210 A | * | 11/2000 | Arnold | 438/243 |
| 6,163,045 A | * | 12/2000 | Mandelman et al. | 257/301 |
| 6,271,557 B1 | * | 8/2001 | Zimmermann et al. | 257/304 |
| 2001/0016398 A1 | * | 8/2001 | Kudelda et al. | 438/427 |

* cited by examiner

Primary Examiner—Tom Thomas
Assistant Examiner—Quang Vu
(74) Attorney, Agent, or Firm—Stanton Braden

(57) ABSTRACT

A deep trench capacitor, in accordance with the present invention, includes a deep trench formed in a substrate having a storage node formed therein. A center node is capacitively coupled to the storage node. The center node is disposed within the deep trench and formed inside the storage node. A first buried strap is provided for accessing the storage node, and a second buried strap is electrically isolated from the storage node and formed in contact with the center node and a buried plate. The center node is formed to provide additional capacitive area to the deep trench capacitor. A method for forming the deep trench capacitor in accordance with the present invention is also provided.

13 Claims, 15 Drawing Sheets

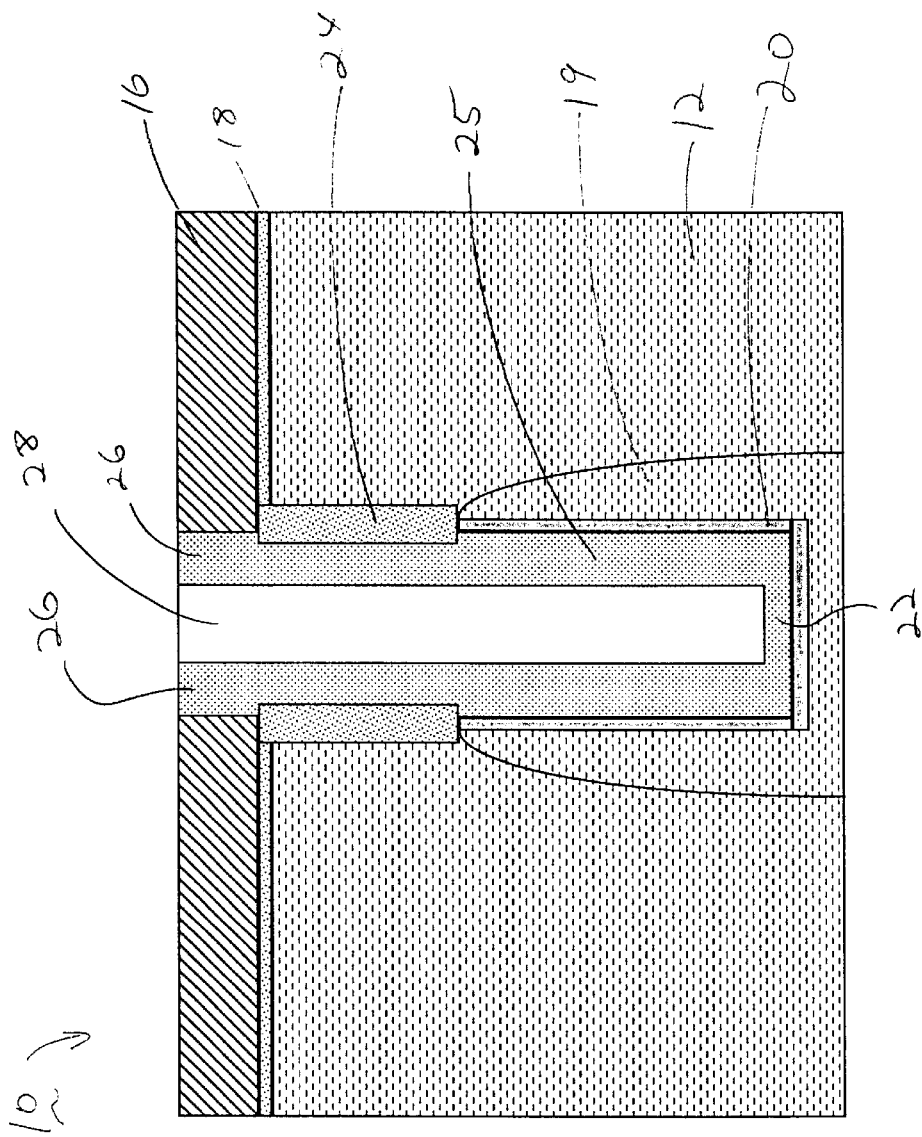

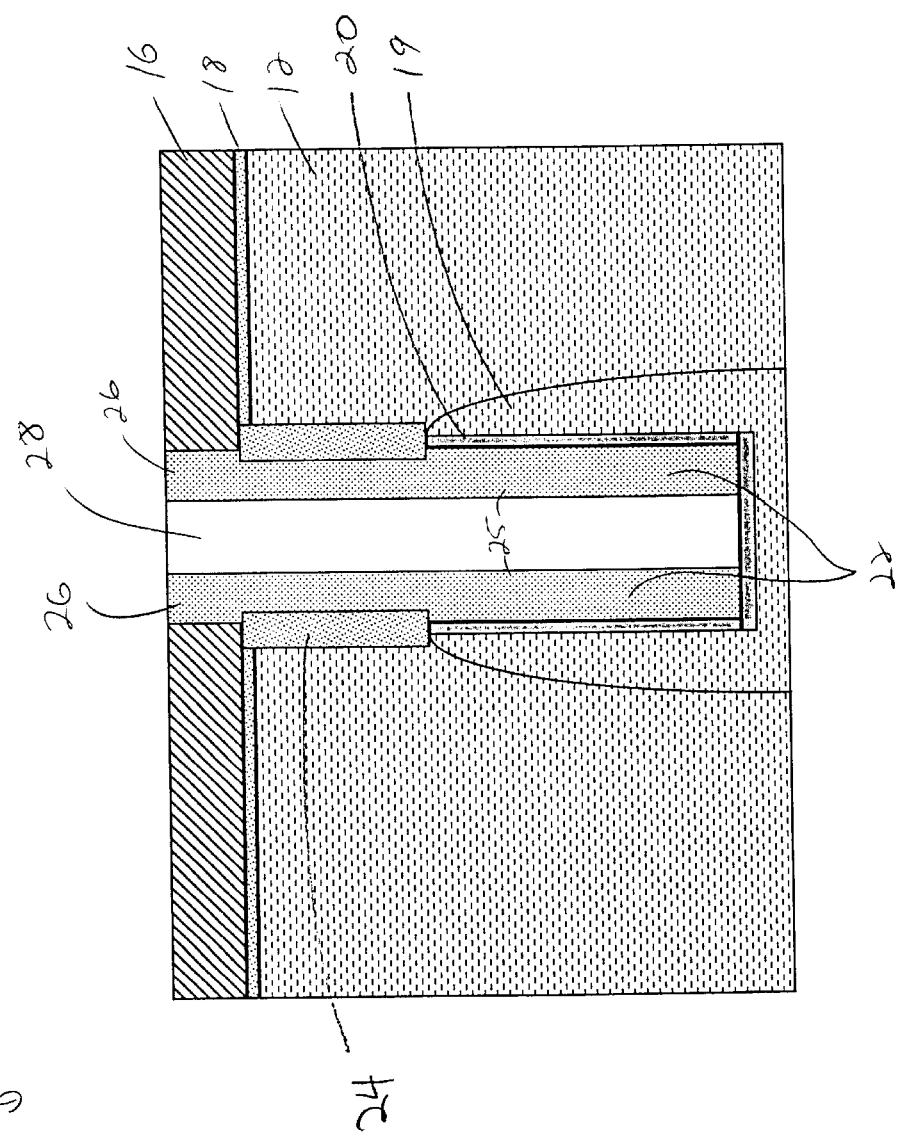

FOLDED DEEP TRENCH CAPACITOR AND METHOD

BACKGROUND

1. Technical Field

This disclosure relates to semiconductor devices and fabrication methods and more particularly, to a folded deep trench capacitor structure, which increases capacity for deep trench capacitors.

2. Description of the Related Art

In semiconductor memory devices, for example, dynamic random access memory (DRAM) devices, memory cells include capacitors for storing data. The data stored in the capacitors is read from and written to through bitlines. The memory cells need to maintain a relationship between the storage capacitor's capacitance and the bitline capacitance to maintain a sensible voltage difference between bitline and complement bitline voltages, that is, to distinguish between a '0' and '1' read from the storage capacitor. With further shrinking of minimum feature sizes, critical dimensions (CD) must be compensated for by maintaining a higher or at least equal storage capacity.

Storage capacitors may include deep trench capacitors. Deep trench capacitors provide the ability to extend deep into a substrate to provide adequate storage while minimizing the cost of layout area. One way of achieving the relationship of capacity between bitlines and deep trench capacitors with smaller CD's is by etching the trenches deeper or as deep as before with a smaller CD. This requires thicker resists for etching the deeper trenches, which makes the resist budget more critical and other procedures, like hard mask processes, have to be developed to accommodate deeper trenches. Further, critical dimensions must be maintained as large as possible to permit access to the smaller width of trench for processing. This makes the alignment budget more critical as well.

Therefore, a need exists for a deep trench capacitor structure, which increases the capacitance so that both width and depth dimensions could be relaxed, and the area occupied by deep trench is at least the same as the prior art.

SUMMARY OF THE INVENTION

A deep trench capacitor, in accordance with the present invention, includes a deep trench formed in a substrate having a storage node formed therein. A center node is capacitively coupled to the storage node. The center node is disposed within the deep trench and formed inside the storage node. A first buried strap is provided for accessing the storage node, and a second buried strap is electrically isolated from the storage node and formed in contact with the center node and a buried plate formed in the substrate surrounding the deep trench. The center node is formed to provide additional capacitive area to the deep trench capacitor.

In other embodiments, the center node and the storage node may have a nitride layer disposed therebetween. The center node may extend to a bottom of the deep trench. The first buried strap is preferably coupled to a transistor for enabling access to the storage node. The buried plate and the center node preferably represent a first capacitor plate of the deep trench capacitor, and the storage node preferably represents a second capacitor plate of the deep trench capacitor.

A method for forming a deep trench capacitor, in accordance with the invention, includes a node dielectric formed in a lower portion of the deep trench and a collar formed in an upper portion of the deep trench. The deep trench is filled with a conductive material to form a storage node. A center trench is formed into the storage node, and the center trench is centrally disposed within the storage node. A center node dielectric layer is then deposited in the center trench. The center trench is filled with the conductive material to form a center node separated from the storage node by the center node dielectric layer. A hole is formed to expose a portion of the center node and a portion of a substrate surrounding the deep trench, the hole also exposes a portion of the storage node. A dielectric cap is formed on the portion of the storage node exposed in the hole, and a conductive material is deposited in the hole to connect the center node to a buried plate surrounding the lower portion of the deep trench.

Another method for forming a deep trench capacitor with a center node includes forming a deep trench in a semiconductor substrate, lining the deep trench with a node dielectric layer, filling the deep trench with a conductive material, recessing the conductive material and removing the node dielectric layer from an upper portion of the deep trench to expose a portion of the substrate. A collar is formed in the upper portion of the deep trench on the exposed portion of the substrate and by partially refilling the trench with the conductive material a storage node is formed with a void which forms a center trench in the storage node. A center node dielectric layer is deposited in the center trench. The center trench is filled with the conductive material to form a center node. A hole is formed to expose a portion of the center node and a portion of the substrate, the hole also exposes a portion of the storage node. A dielectric cap is formed on the portion of the storage node exposed in the hole, and conductive material is deposited in the hole to connect the center node to a buried plate surrounding the deep trench.

In other methods, the step of forming a center trench into the storage node may include the step of etching the center trench into the storage node. The step of forming a center trench into the storage node may include the step of underfilling the deep trench with conductive material to form the storage node having the center trench provided therein. The step of forming a center trench into the storage node may include the step of forming the center trench to the bottom of the deep trench. The method may include the step of forming the buried plate surrounding the lower portion of the deep trench wherein the center node is coupled to the buried plate to form a first electrode of the deep trench capacitor.

In still other methods, the step of forming a dielectric cap on the portion of the storage node exposed in the hole may include the steps of depositing an oxide layer in the hole to cover the exposed portion of the storage node in the hole, thinning the oxide layer and depositing a nitride layer over the oxide layer. The method may include the step of removing portions of the oxide layer and the nitride layer to form the dielectric layer over the portion of the storage node. The method may further include the step of forming a buried strap for accessing the storage node.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 5A is a cross-sectional view of the structure of FIG. 4 showing a center trench formed in the deep trench filled with conductive material, the center trench may be formed by underfilling the trench with conductive material or etching the center trench, in accordance with the present invention;

FIG. 5B is a cross-sectional view of the structure of FIG. 4 showing a center trench formed to the bottom of the deep trench in accordance with the present invention;

DETAILED DESCRIPTION OF PREFERRED EMBODIMENTS

The present invention provides a folded deep trench capacitor structure, which provides increased capacitance without increased trench width. This provides at least a 40 to 50% higher deep trench capacity with the same area demand as conventional deep trench structures. Advantageously, the width critical dimension as well as the deep trench etch depth can be relaxed and at least the same deep trench capacity can be achieved. In one implementation of the deep trench structure of the present invention, a second buried strap is formed connecting an inner electrode to a substrate, which surrounds the deep trench. The deep trench structure of the present invention preferably employs available deep trench, collar and buried strap technology.

Figure 1:
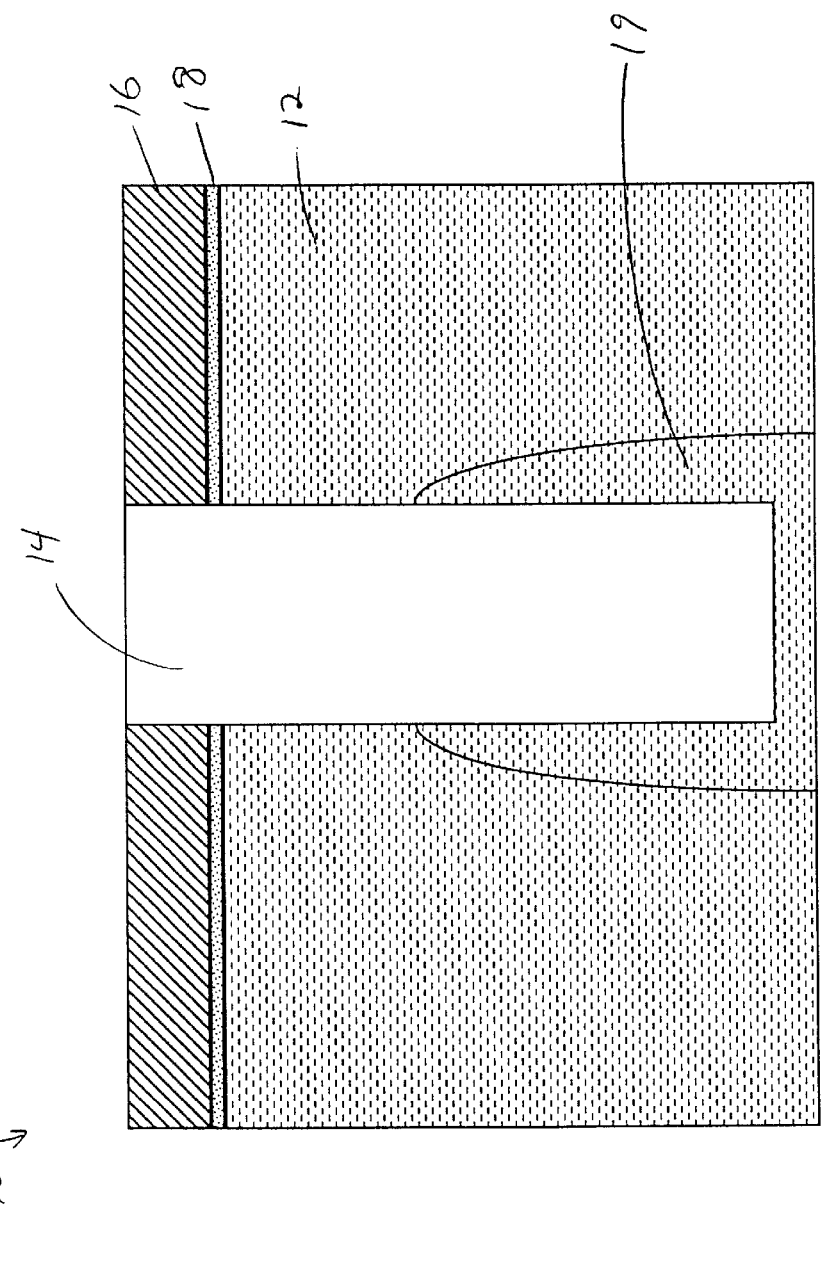
FIG. 1 is a cross-sectional view showing a deep trench formed in a substrate and a buried plate formed in accordance with the prior art.

Referring now in specific detail to the drawings in which like reference numerals identify similar or identical elements throughout the several views, and initially to FIG. 1, a partially fabricated semiconductor device 10 is shown. Device 10 includes a semiconductor substrate 12, preferably, a monocrystalline silicon substrate. FIG. 1 shows a deep trench 14 formed in substrate 12. Deep trench 14 may be formed by conventional processes, such as a reactive ion etch (RIE) using a hardmask (not shown) patterned as is known in the art. A pad nitride layer 16 and a pad oxide layer 18 are formed before hard mask deposition and patterning as is also known in the art. Other materials and processes may be employed to form trench 14. A buried plate 19 is formed surrounding trench 14. Buried plate 19 may be formed by implanting dopants in substrate 12 adjacent to a lower portion of trench 14.

Figure 2:
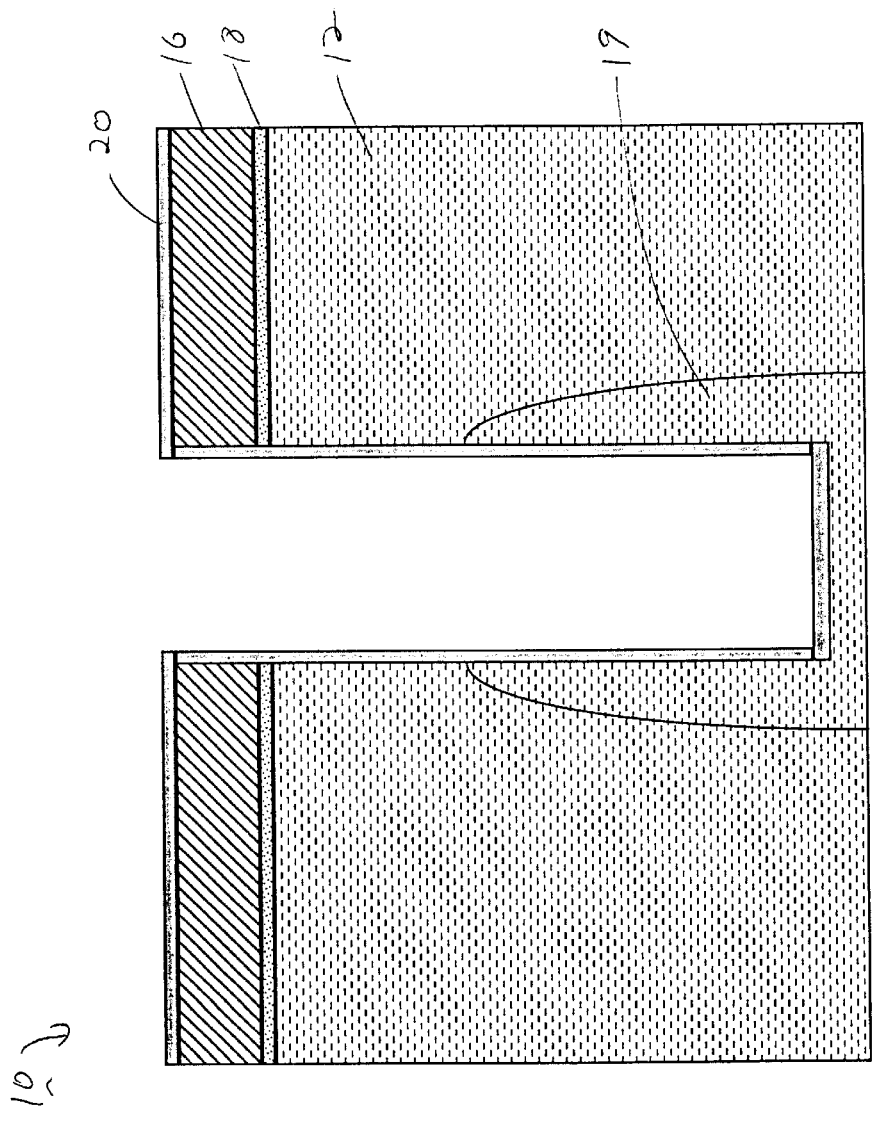
FIG. 2 is a cross-sectional view of the structure of FIG. 1 showing a node dielectric layer formed in accordance with the prior art.

Referring to FIG. 2, a liner 20 is formed in trench 14. Liner 20 preferably includes a nitride material. Liner 20 is relatively thin, for example about 6 nm in thickness. Liner 20 is formed by processes known to those skilled in the art.

Figure 3:
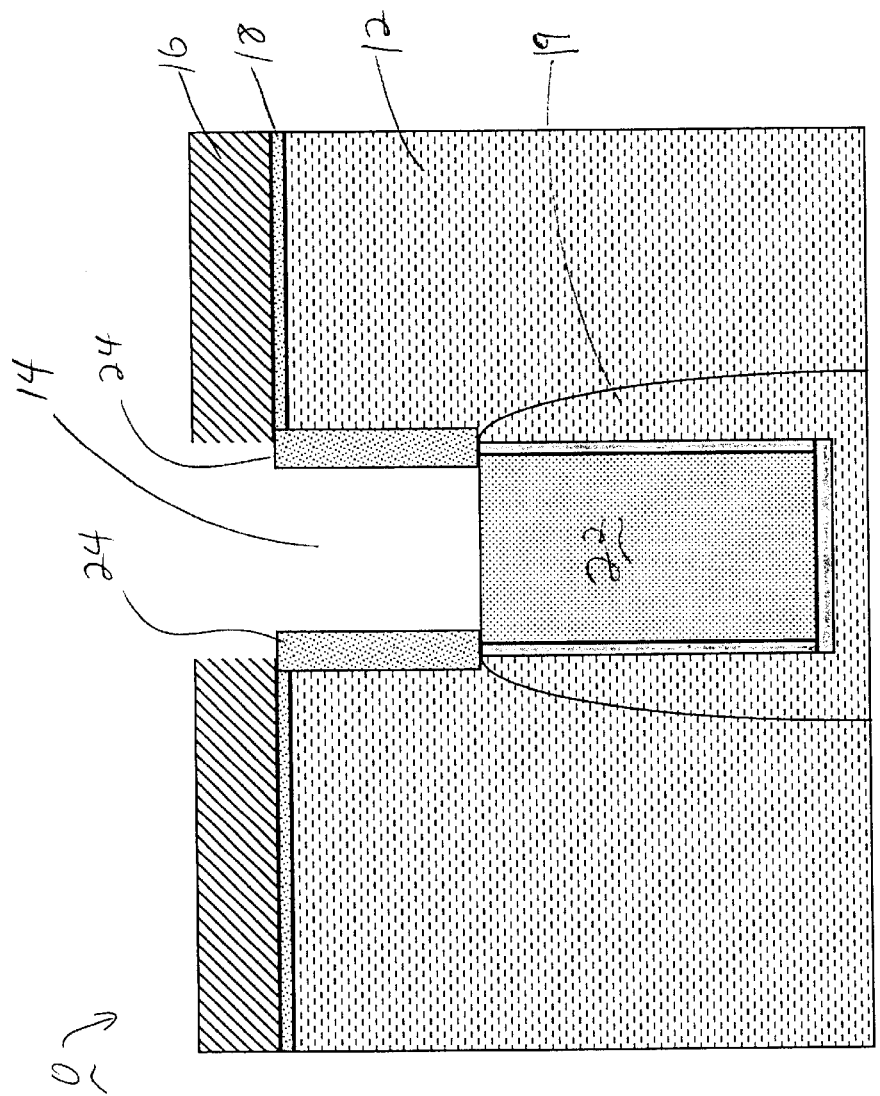
FIG. 3 is a cross-sectional view of the structure of FIG. 2 showing the deep trench filled and recessed to remove a portion of the node dielectric layer and to form a collar in accordance with the prior art.

Referring to FIG. 3, a first filler material 22 is deposited to fill trench 14. First filler material 22 preferably includes doped polysilicon. First filler material 22 is recessed in trench 14 and portions of liner 20 are removed in areas other than those covered by filler material 22. A collar 24 is formed by local oxidation of silicon (LOCOS), by depositing an oxide or by growing an oxide within trench 14.

Figure 4:
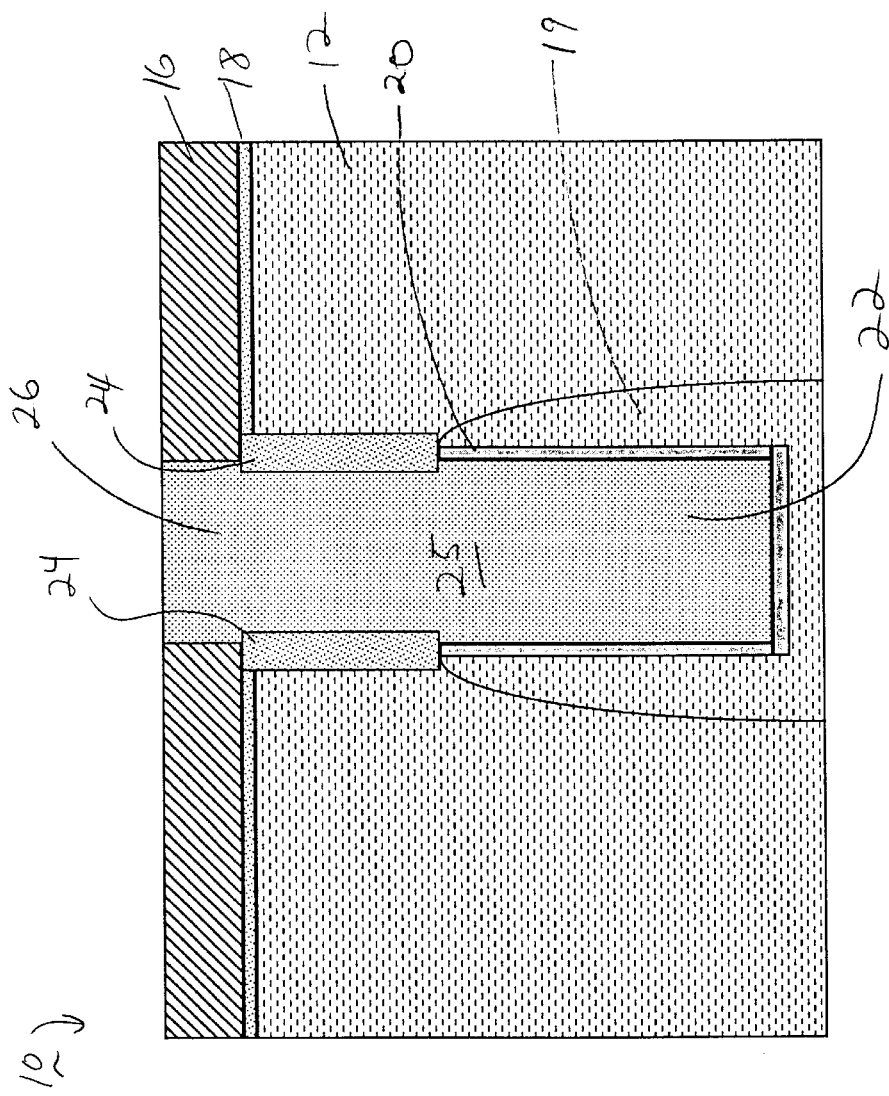
FIG. 4 is a cross-sectional view of the structure of FIG. 3 showing the deep trench filled with conductive material in accordance with the prior art.

Referring to FIG. 4, a second filler material 26 is deposited to fill trench 14. Second filler material 26 is formed from a same material as first filler material 22, preferably doped polysilicon. Filler materials 22 and 26 will be hereafter referred to collectively as a storage node 25. A planarization step is preferably employed, for example, a chemical mechanical polish (CMP) to planarize second filler material 26 down to pad nitride 16.

Referring to FIG. 5A, in one embodiment of the present invention, a center trench 28 is formed in trench 14 by further recessing material 22 and underfilling trench 14 shown in FIG. 4 with filler material 26, preferably doped polysilicon, and more preferably low pressure chemical vapor deposited polysilicon. Filler material 26 is deposited such that material 26 underfills trench 14 leaving a void, which forms center trench 28. Material 26 may then be removed from a top surface of device 10.

In an alternate embodiment, a lithography process is employed to pattern center trench 28 in material 22 and 26 of FIG. 4. With the lithography process, storage node 25 is patterned preferably by a photolithography process. For example, a resist layer (not shown) is spun onto a top surface of device 10, exposed in accordance with a photomask and developed to open up a hole in the resist layer over storage node 25. An etching process, such as, reactive ion etching (RIE), is preferably employed to etch out a center trench 28 of storage node 25. It should be understood that center trench 28 may extend (e.g., be etched) to the bottom of deep trench 14, as shown in FIG. 5B, although center trench may extend to any intermediate position within deep trench 14, as shown in FIG. 5A. Either process (e.g., underfill process or lithography process) may be employed to form center trench 28; however, the underfilling process is preferred since an additional lithography step and an etch step are advantageously avoided.

Figure 6:
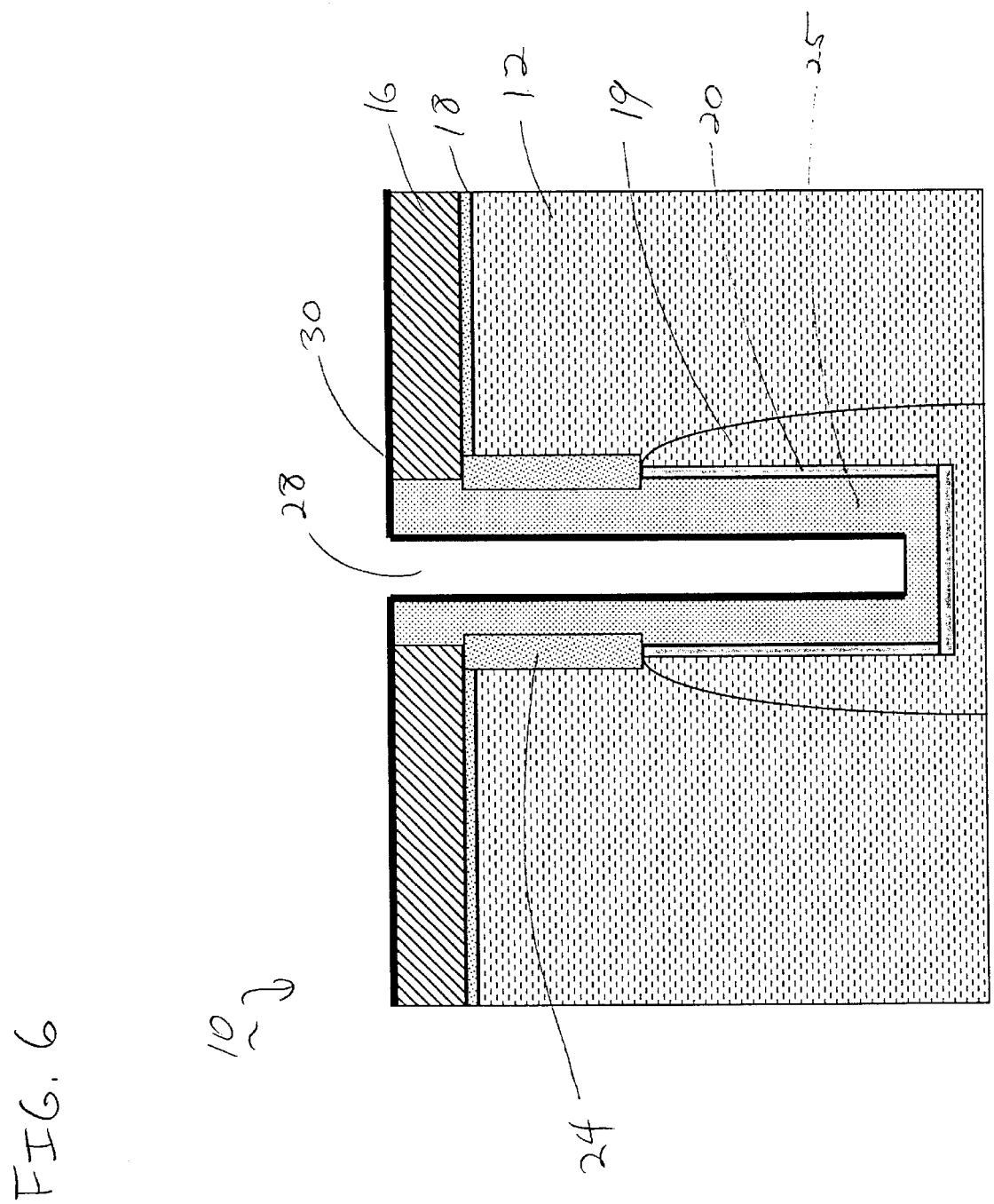
FIG. 6 is a cross-sectional view of the structure of FIG. 5 showing the center trench being lined with a dielectric layer in accordance with the present invention.

Referring to FIG. 6, a dielectric layer 30 is deposited to line surfaces of center trench 28. Layer 30 preferably includes a nitride material. Layer 30 may be as thin as 2–3 nm, although thicknesses of about 6 nm may be employed.

Figure 7:
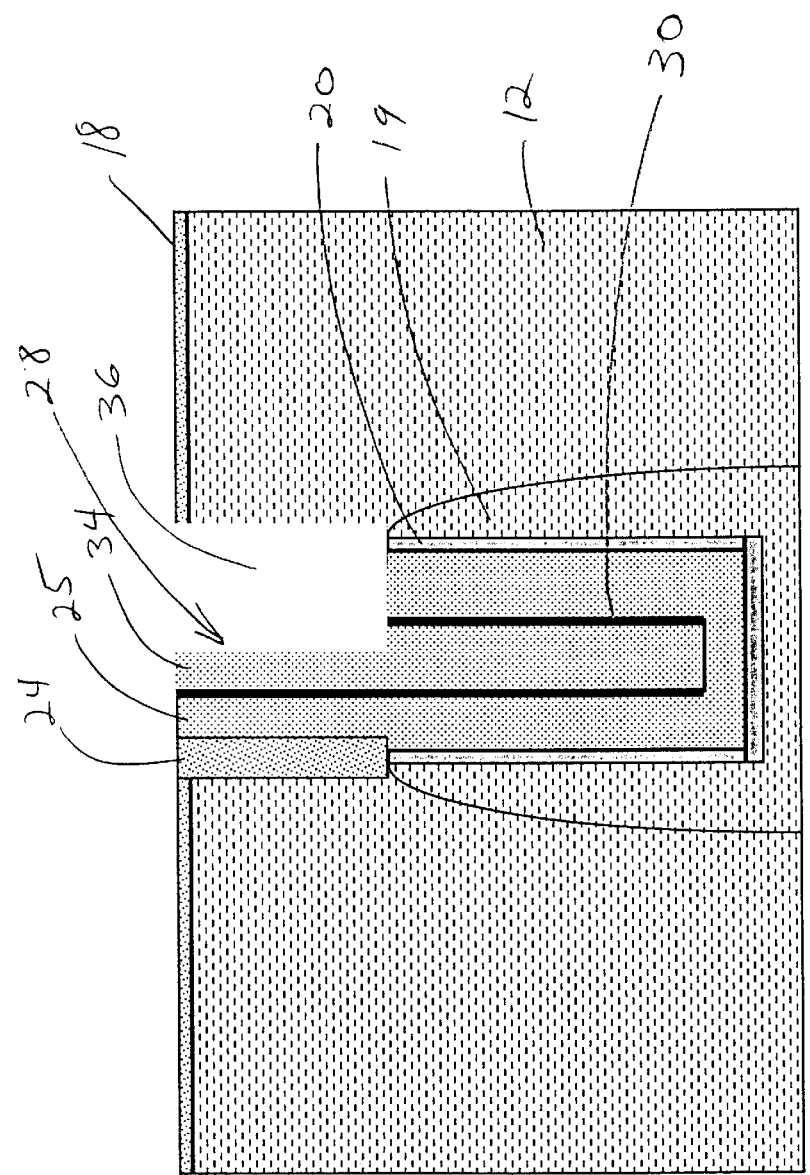
FIG. 7 is a cross-sectional view of the structure of FIG. 6 showing a shallow trench formed therein in accordance with the present invention.

Referring to FIG. 7, a third filler material 32 is deposited in center trench 28 to form a center node 34. Third filler material 32 preferably includes doped polysilicon. Material 32, layer 30 and nitride pad 16 are all removed from the top surface of device 10. A shallow trench 36 is patterned into portions of collar 24, storage node 25 and center node 34. Shallow trench 36 is formed by preferably employing a photolithography process, including resist deposition, exposure and development, followed by an etch, such as RIE. The etching employed during the formation of shallow trench 36 exposes center node 34 and substrate 12. A connection between center node 34 and substrate 12 will be formed in shallow trench 36 in later steps.

Figure 8:
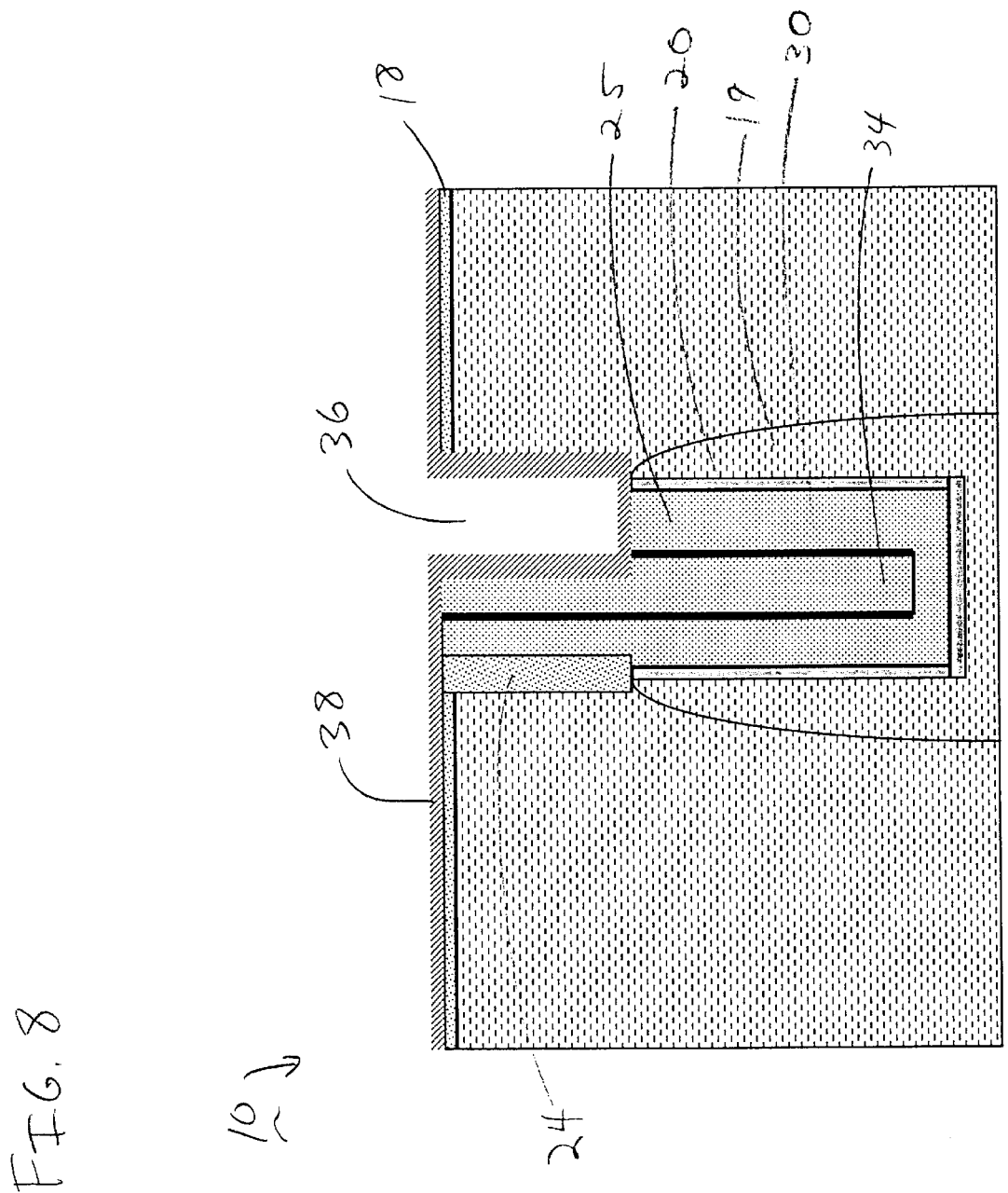
FIG. 8 is a cross-sectional view of the structure of FIG. 7 showing a dielectric layer (e.g., oxide) formed in the shallow trench in accordance with the present invention.

Referring to FIG. 8, a dielectric layer 38 is formed in shallow trench 36. Dielectric layer 38 may be formed in a same way as collar 24. In a preferred embodiment, dielectric layer 38 includes a deposited oxide. Dielectric layer provides protection of the sidewalls and bottom of shallow trench 36. Dielectric layer 38 preferably includes a thickness of between, for example, about 20 nm and about 30 nm.

Figure 9:
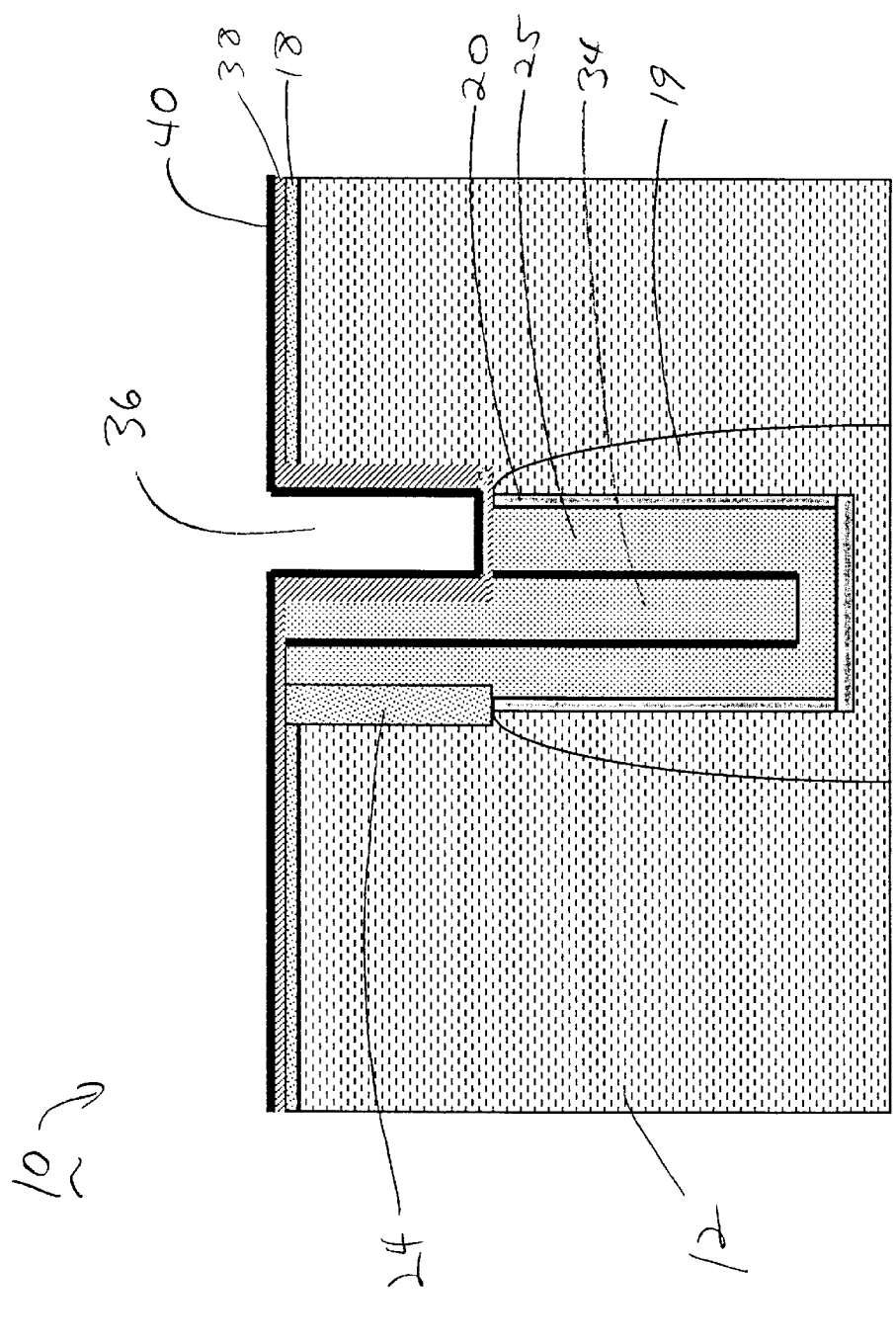
FIG. 9 is a cross-sectional view of the structure of FIG. 8 showing another dielectric layer (e.g., nitride) formed in the shallow trench in accordance with the present invention.

Referring to FIG. 9, dielectric layer 38 is subjected to an anisotropic etch, such as a RIE process, to thin dielectric layer 38 at the bottom of shallow trench 36. Dielectric layer 38 is preferably thinned to a thickness of between about 10 nm and about 20 nm. A liner 40 is deposited over dielectric layer 38. The thinned portion of dielectric layer 38 provides support for liner 40 at the bottom of shallow trench 36. Liner 40 preferably includes nitride between 2–6 nm in thickness. Liner 40 is thinner along sidewalls of shallow trench 36 as is typical due to the deposition process. Liner 40 may include an oxy-nitride liner. Alternately, liner 40 may be employed without dielectric layer 38.

Figure 10:
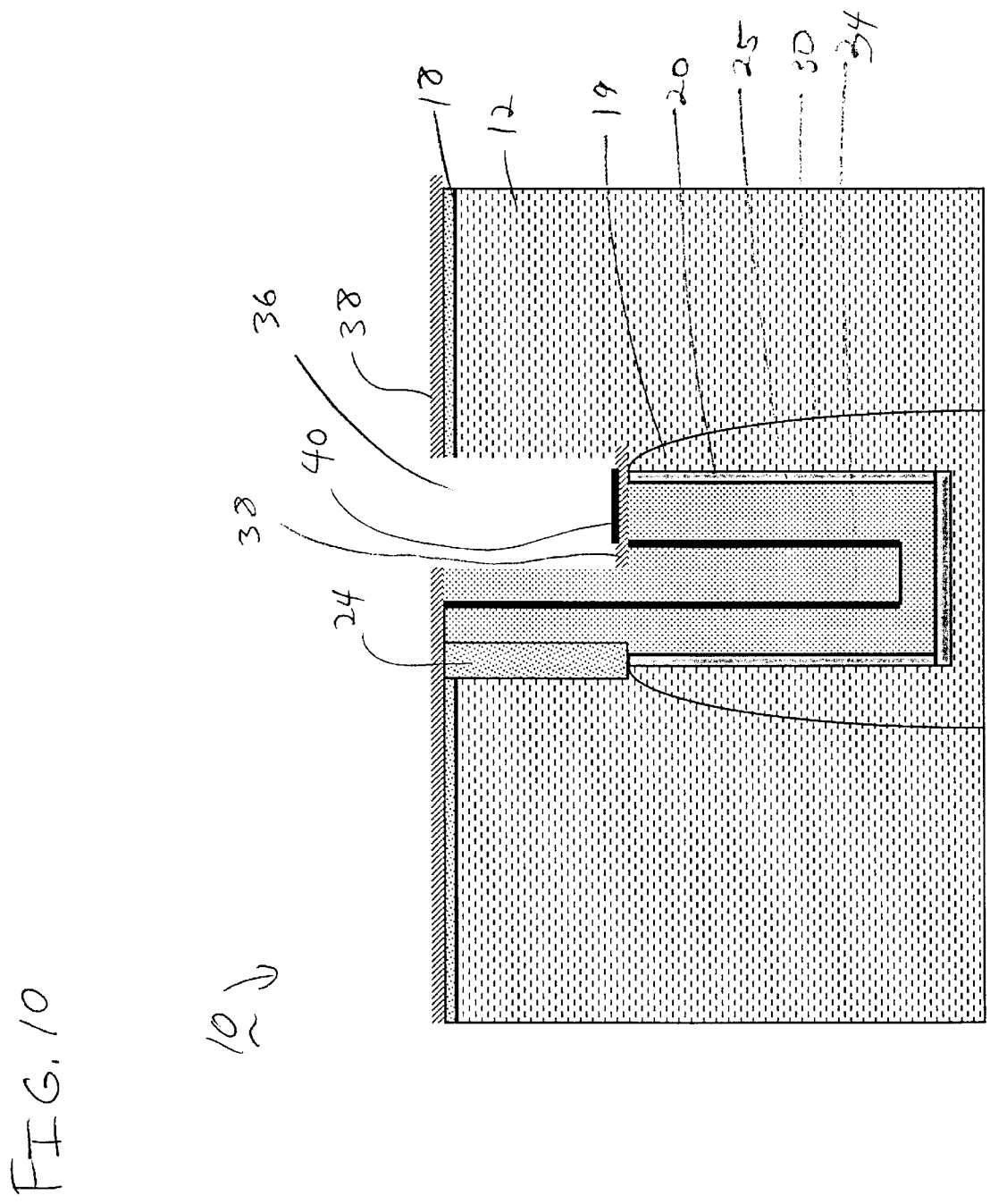
FIG. 10 is a cross-sectional view of the structure of FIG. 9 showing a dielectric cap formed at the bottom of the shallow trench in accordance with the present invention.

Referring to FIG. 10, liner 40 is etched to remove liner 40 from sidewalls of trench 36. A wet etch, for example an HF or buffered HF etch, is employed to remove dielectric layer 38 from sidewalls of shallow trench 36. This creates a window between center node 34 and substrate 12. Liner 40 and dielectric layer 38 remain as an insulator between shallow trench 36 and storage node 25.

Figure 11:
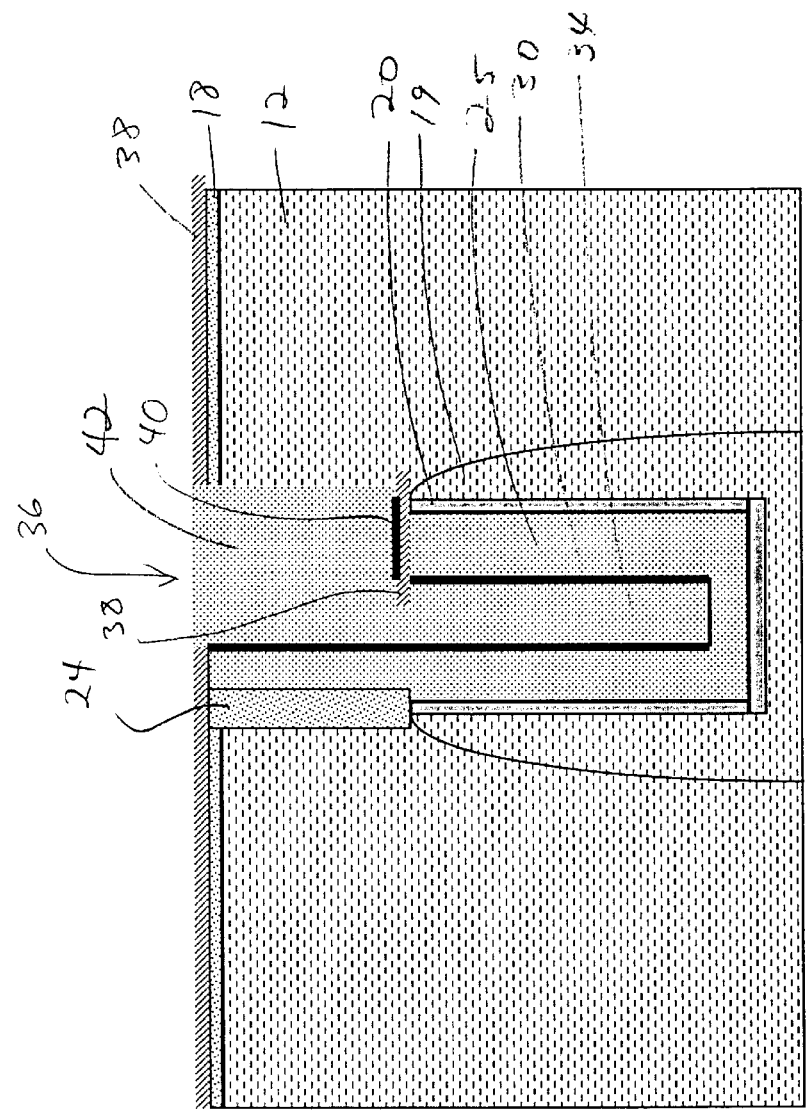
FIG. 11 is a cross-sectional view of the structure of FIG. 10 showing the shallow trench filled with conductive material to form a connection between the substrate and the center node in accordance with the present invention.

Referring to FIG. 11, a fourth filler material 42 is deposited to fill shallow trench 36. A planarization step is employed to planarize a top surface of device 10 to remove filler material 42 from the surface. Filler material 42 preferably includes doped polysilicon. Dielectric layer 38 may function as a polish/etch stop for the planarization process (e.g., CMP). Filler material 42 provides a connection (an additional buried strap, for example) between center node 34 and buried plate 19.

Figure 12:
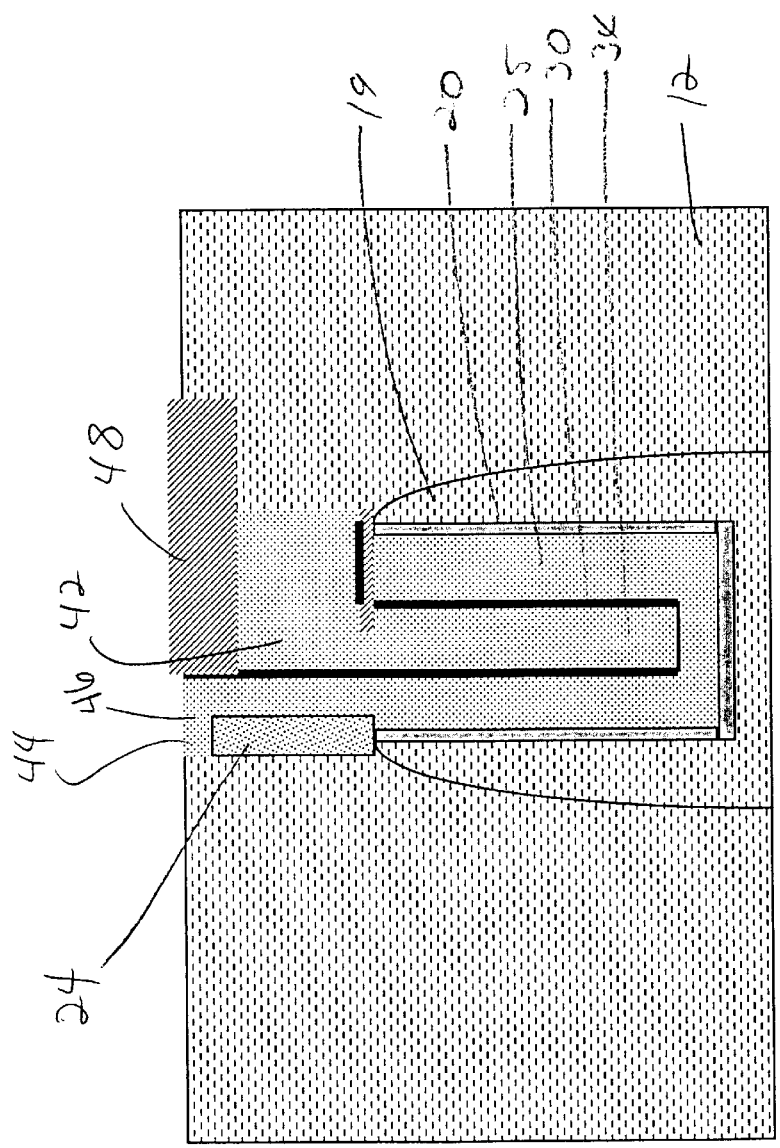
FIG. 12 is a cross-sectional view of the structure of FIG. 11 showing a first buried strap (46) and a trench top dielectric formed in accordance with the present invention.

Referring to FIG. 12, portions of filler material 42, storage node 25 and collar 24 are recessed back. Conductive material 44 is deposited to form a buried strap 46. Buried strap 46 preferably includes doped polysilicon. Buried strap 46 may be enhanced by an additional doping process, by employing doping processes known in the art. Conductive material is recessed again to permit deposition of a trench top oxide 48. This provides a folded deep trench structure in accordance with the present invention.

Figure 13:
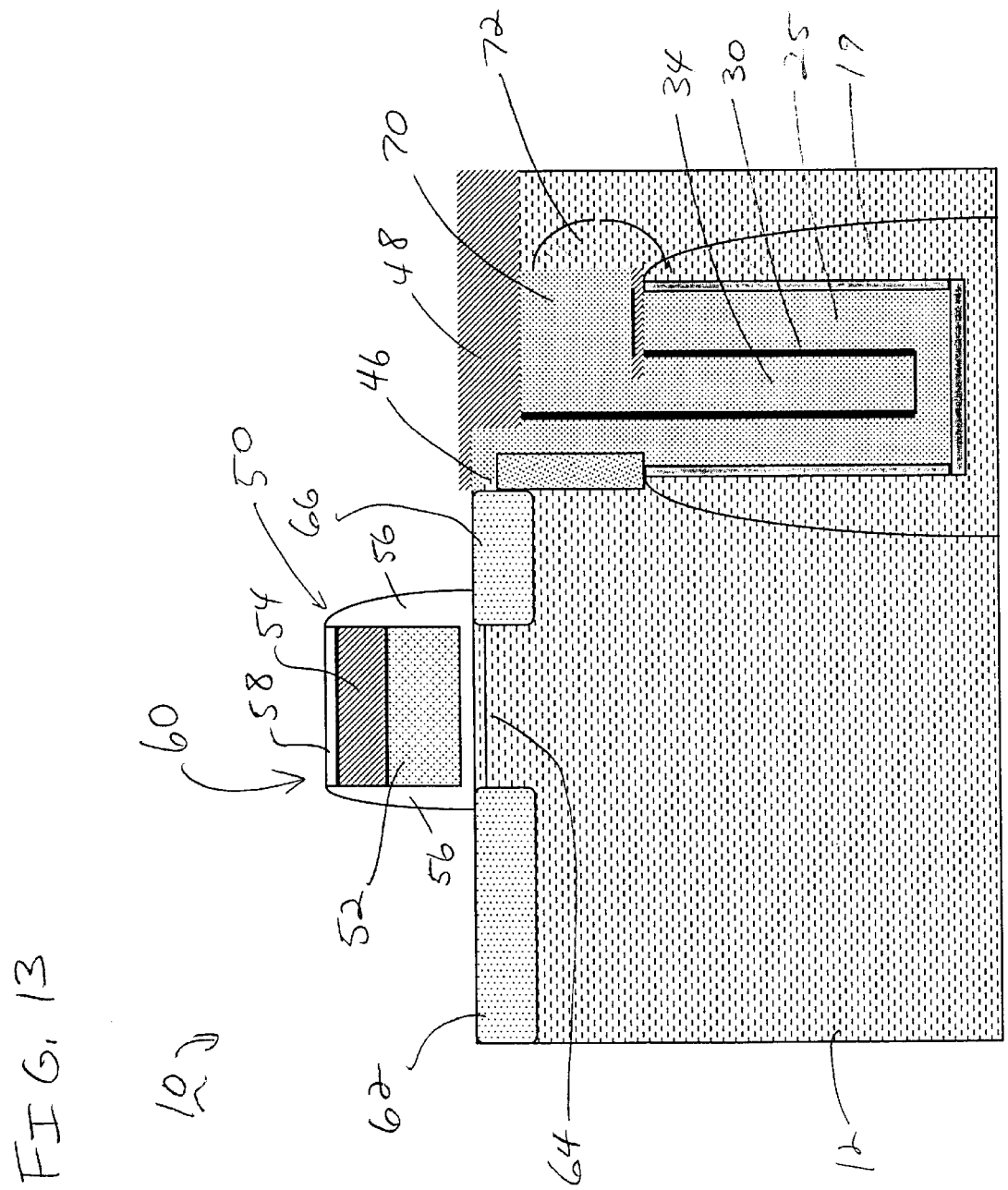
FIG. 13 is a cross-sectional view of the structure of FIG. 12 showing a second buried strap (70) and an access transistor formed in accordance with the present invention.

Referring to FIG. 13, processing continues to form an access transistor 60. Access transistor 60 includes a gate structure 50 (e.g., a wordline), which includes a doped polysilicon conductor 52 and silicide layer 54. Dielectric spacers 56 and a cap 58 are formed, preferably of nitride, to provide insulation around gate structure 50. When gate structure 50 is activated, current is permitted to flow between diffusion region 62 and storage node 25 through a channel 64, a diffusion region 66, and buried strap 46. This permits charging and discharging of storage node 25. Storage node 25 represents a first capacitor plate of the folded deep trench structure. Center node 34 is connected to buried plate 19 to form a second plate of the deep trench capacitor in accordance with the present invention. A second buried strap 70 is formed, which outdiffuses into surrounding regions 72. This outdiffusion region 72 combines with dopants of buried plate 19 to form the second plate of the capacitor. This outdiffusion may be assisted by performing an annealing step, such as a rapid thermal anneal or other anneal process to cause sufficient outdiffusion from buried strap 70. To further assist outdiffusion, additional doping of buried strap 70 may be provided. By increasing dopant concentration of buried strap 70 better conduction between buried plate 19 and buried strap 70 is advantageously provided.

When charging or discharging storage node, the voltage of buried plate 19 is modified by a voltage pump through substrate 12. Processing may now continue as is known in the art.

To calculate capacitance the following formula is used:

$$C = \epsilon_0 \epsilon_R A / S,$$

where C is the capacitance, $\epsilon_0$ is a dielectric constant for permittivity of free space, $\epsilon_R$ is the dielectric constant for permittivity through the capacitor dielectric, A is the surface area between the capacitor plates and S is the thickness of the capacitor dielectric. Possible improvements in capacitance may come from: material with better dielectric qualities ($\epsilon_0$, $\epsilon_R$), thinner node dielectric (S) and/or area increase. The present invention focuses on increasing area, to achieve increased capacity.

Figure 14:
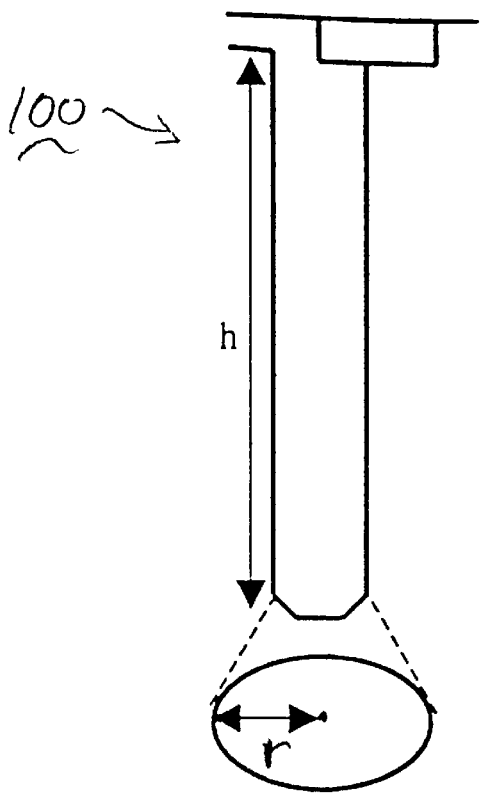
FIG. 14 is a cross-sectional schematic view of the structure of a deep trench capacitor in accordance with the prior art.

Referring to FIG. 14, a schematic of a conventional deep trench capacitor is shown. The area of the capacity is determined by the size of the cylinder area of a deep trench 100. Assuming a perfect cylinder with round ground area, the area can be calculated by the following:

$A = 2r^2 + 2rh$, where r is the radius of the cylinder and h is the height of the cylinder. Assuming a radius of 0.3 microns and a height of 6 microns the area is 11.87 microns$^2$.

Figure 15:
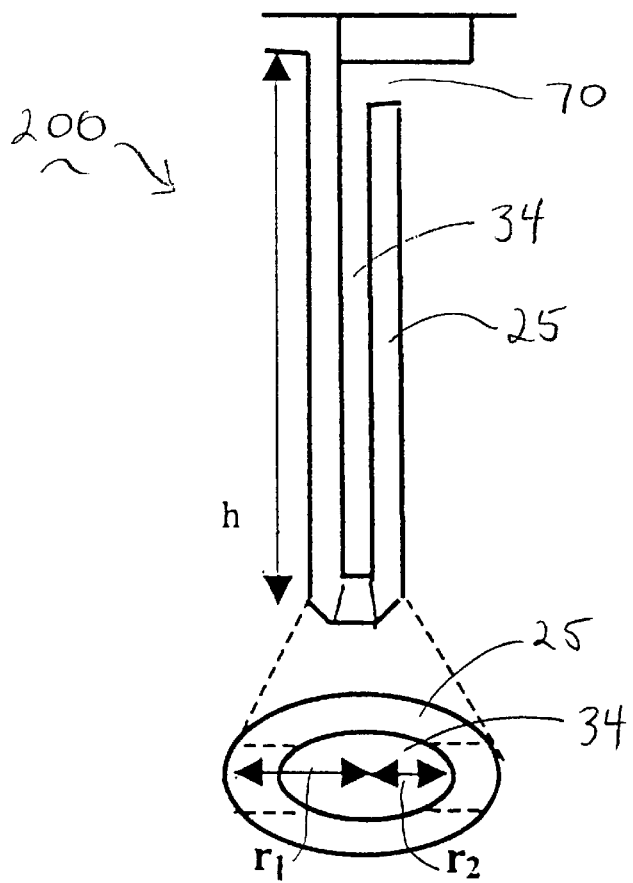
FIG. 15 is a cross-sectional schematic view of the structure of a folded deep trench capacitor in accordance with the present invention.

Referring to FIG. 15, a folded trench structure 200 in accordance with the present invention includes a larger area. Advantageously, the active area of the capacity could be increased by at least 40–50% over the prior art. This may also be increased by 100% or beyond. The area calculation for the present invention may illustratively be performed as follows:

$A = 2(r_1^2 - r_2^2) + 2r_1h + 2r_2h$ where $r_1$ is the radius of the storage node 25, $r_2$ is the radius of the center node 34 and h is the height (assumed to be approximately the same for both nodes). Assuming a radius $r_1$ of 0.3 microns, $r_2$ of 0.15 microns and a height of 6 microns the area is 17.95 microns$^2$!

Having described preferred embodiments for folded deep trench capacitor and method (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming a deep trench capacitor, including a node dielectric formed in a lower portion of the deep trench and a collar formed in an upper portion of the deep trench, the deep trench being filled with a conductive material to form a storage node, comprising the steps of:

forming a center trench into the storage node, the center trench being centrally disposed within the storage node;

depositing a center node dielectric layer in the center trench;

filling the center trench with the conductive material to form a center node separated from the storage node by the center node dielectric layer;

forming a hole to expose a portion of the center node and a portion of a substrate surrounding the deep trench, the hole also exposing a portion of the storage node;

forming a dielectric cap on the portion of the storage node exposed in the hole; and depositing conductive material in the hole to connect the center node to a buried plate surrounding the lower portion of the deep trench.

2. The method as recited in claim 1, wherein the step of forming a center trench into the storage node includes the step of etching the center trench into the storage node.

3. The method as recited in claim 1, wherein the step of forming a center trench into the storage node includes the step of underfilling the deep trench with conductive material to form the storage node having the center trench provided therein.

4. The method as recited in claim 1, wherein the step of forming a center trench into the storage node includes the step of forming the center trench to the bottom of the deep trench.

5. The method as recited in claim 1, further comprising the step of forming the buried plate surrounding the lower portion of the deep trench wherein the center node is coupled to the buried plate to form a first electrode of the deep trench capacitor.

6. The method as recited in claim 1, wherein the step of forming a dielectric cap on the portion of the storage node exposed in the hole includes the steps of:

depositing an oxide layer in the hole to cover the exposed portion of the storage node in the hole;

thinning the oxide layer; and depositing a nitride layer over the oxide layer.

7. The method as recited in claim 6, further comprising the step of removing portions of the oxide layer and the nitride layer to form the dielectric layer over the portion of the storage node.

8. The method as recited in claim 1, further comprising the step of forming a buried strap for accessing the storage node.

9. A method for forming a deep trench capacitor with a center node comprising the steps of:

forming a deep trench in a semiconductor substrate;

lining the deep trench with a node dielectric layer;

filling the deep trench with a conductive material;

recessing the conductive material and removing the node dielectric layer from an upper portion of the deep trench to expose a portion of the substrate;

forming a collar in the upper portion of the deep trench on the exposed portion of the substrate;

partially refilling the trench with the conductive material to form a storage node with a void forming a center trench in the storage node;

depositing a center node dielectric layer in the center trench;

filling the center trench with the conductive material to form a center node;

forming a hole to expose a portion of the center node and a portion of the substrate, the hole also exposing a portion of the storage node;

forming a dielectric cap on the portion of the storage node exposed in the hole; and depositing conductive material in the hole to connect the center node to a buried plate surrounding the deep trench.

10. The method as recited in claim 9, further comprising the step of forming a buried plate surrounding the deep trench wherein the center node is coupled to the buried plate to form a first electrode of the deep trench capacitor.

11. The method as recited in claim 9, wherein the step of forming a dielectric cap on the portion of the storage node exposed in the hole includes the steps of:

depositing an oxide layer in the hole to cover the exposed portion of the storage node in the hole;

thinning the oxide layer; and depositing a nitride layer over the oxide layer.

12. The method as recited in claim 11, further comprising the step of removing portions of the oxide layer and the nitride layer to form the dielectric layer over the portion of the storage node.

13. The method as recited in claim 9, further comprising the step of forming a buried strap for accessing the storage node.

* * * * *